United States Patent
Ho et al.

(10) Patent No.: US 9,620,421 B2
(45) Date of Patent: Apr. 11, 2017

(54) METAL GATE TRANSISTOR, INTEGRATED CIRCUITS, SYSTEMS, AND FABRICATION METHODS THEREOF

(75) Inventors: Chien-Chih Ho, Hsinchu (TW); Chih-Ping Chao, Hsinchu (TW); Hua-Chou Tseng, Hsinchu (TW); Chun-Hung Chen, Xinpu Township (TW); Chia-Yi Su, Yonghe (TW); Alex Kalnitsky, San Francisco, CA (US); Jye-Yen Cheng, Taichung (TW); Harry-Hak-Lay Chuang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 578 days.

(21) Appl. No.: 12/948,184

(22) Filed: Nov. 17, 2010

(65) Prior Publication Data
US 2012/0119306 A1    May 17, 2012

(51) Int. Cl.
*H01L 21/8238* (2006.01)
*H01L 21/768* (2006.01)
*H01L 21/8234* (2006.01)
*H01L 29/51* (2006.01)
*H01L 29/66* (2006.01)

(52) U.S. Cl.
CPC ........... *H01L 21/823842* (2013.01); *H01L 21/76895* (2013.01); *H01L 21/823871* (2013.01); *H01L 21/823425* (2013.01); *H01L 29/513* (2013.01); *H01L 29/517* (2013.01); *H01L 29/518* (2013.01); *H01L 29/66545* (2013.01)

(58) Field of Classification Search
CPC ............. H01L 23/5329; H01L 23/5283; H01L 23/5226
See application file for complete search history.

(56) References Cited

U.S. PATENT DOCUMENTS

| | | | |
|---|---|---|---|
| 5,935,766 A * | 8/1999 | Cheek | H01L 21/76838 257/E21.582 |
| 5,949,092 A * | 9/1999 | Kadosh | H01L 21/8221 257/241 |
| 5,966,597 A * | 10/1999 | Wright | H01L 21/28061 257/E21.2 |
| 6,300,201 B1 | 10/2001 | Shao et al. | |
| 6,737,310 B2 | 5/2004 | Tsai et al. | |
| 2007/0102821 A1* | 5/2007 | Papa Rao et al. | ............. 257/758 |
| 2008/0191352 A1* | 8/2008 | Yu et al. | ................... 257/751 |

* cited by examiner

Primary Examiner — Yu-Hsi D Sun
(74) Attorney, Agent, or Firm — Hauptman Ham, LLP

(57) ABSTRACT

A method of forming an integrated circuit structure includes providing a gate strip in an inter-layer dielectric (ILD) layer. The gate strip comprises a metal gate electrode over a high-k gate dielectric. An electrical transmission structure is formed over the gate strip and a conductive strip is formed over the electrical transmission structure. The conductive strip has a width greater than a width of the gate strip. A contact plug is formed above the conductive strip and surrounded by an additional ILD layer.

21 Claims, 16 Drawing Sheets

METAL GATE TRANSISTOR, INTEGRATED CIRCUITS, SYSTEMS, AND FABRICATION METHODS THEREOF

TECHNICAL FIELD

The present disclosure relates generally to the field of semiconductor devices, and more particularly, to metal gate transistors, integrated circuits, systems, and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

As the technology continues to be scaled down, e.g., for 28 nanometer (nm) technology nodes and below, metal gate electrodes with narrow widths may introduce an issue of high gate resistance. The issue of high gate resistance may affect the electrical performance of CMOS devices. For example, the high gate resistance may degrade the maximum oscillation frequency (fmax), noise, and stability of radio frequency CMOS (RFCMOS) devices performing at high frequencies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF ILLUSTRATIVE EMBODIMENTS

Figure 1:
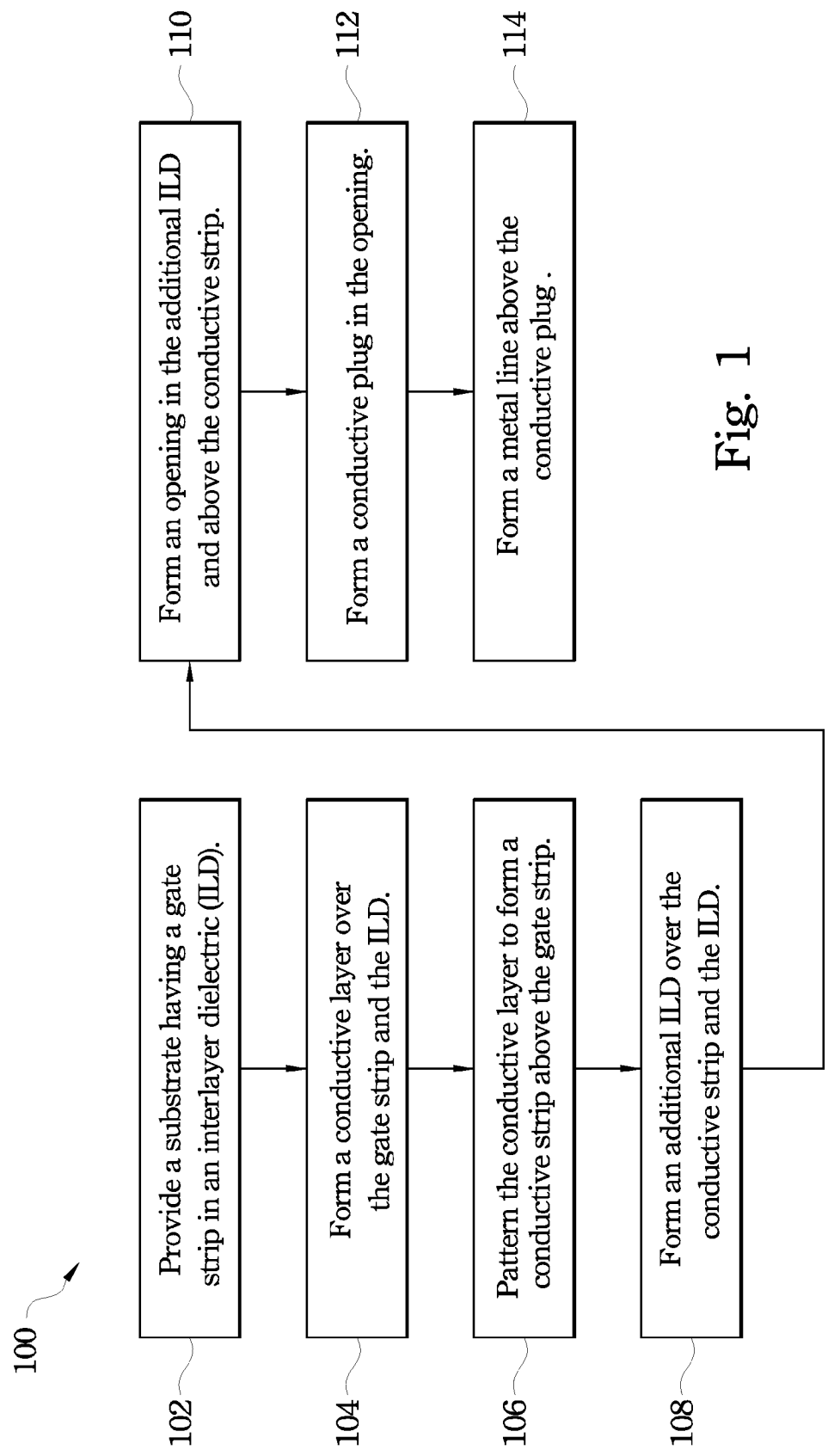
FIG. 1 is a flow chart of a method for fabricating an integrated circuit device according to an embodiment of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 2-7A, various diagrammatic cross-sectional and perspective views of an embodiment of a semiconductor device 200 during various fabrication stages according to a method 100 of FIG. 1 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), radio frequency CMOS (RFCMOS), high voltage transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
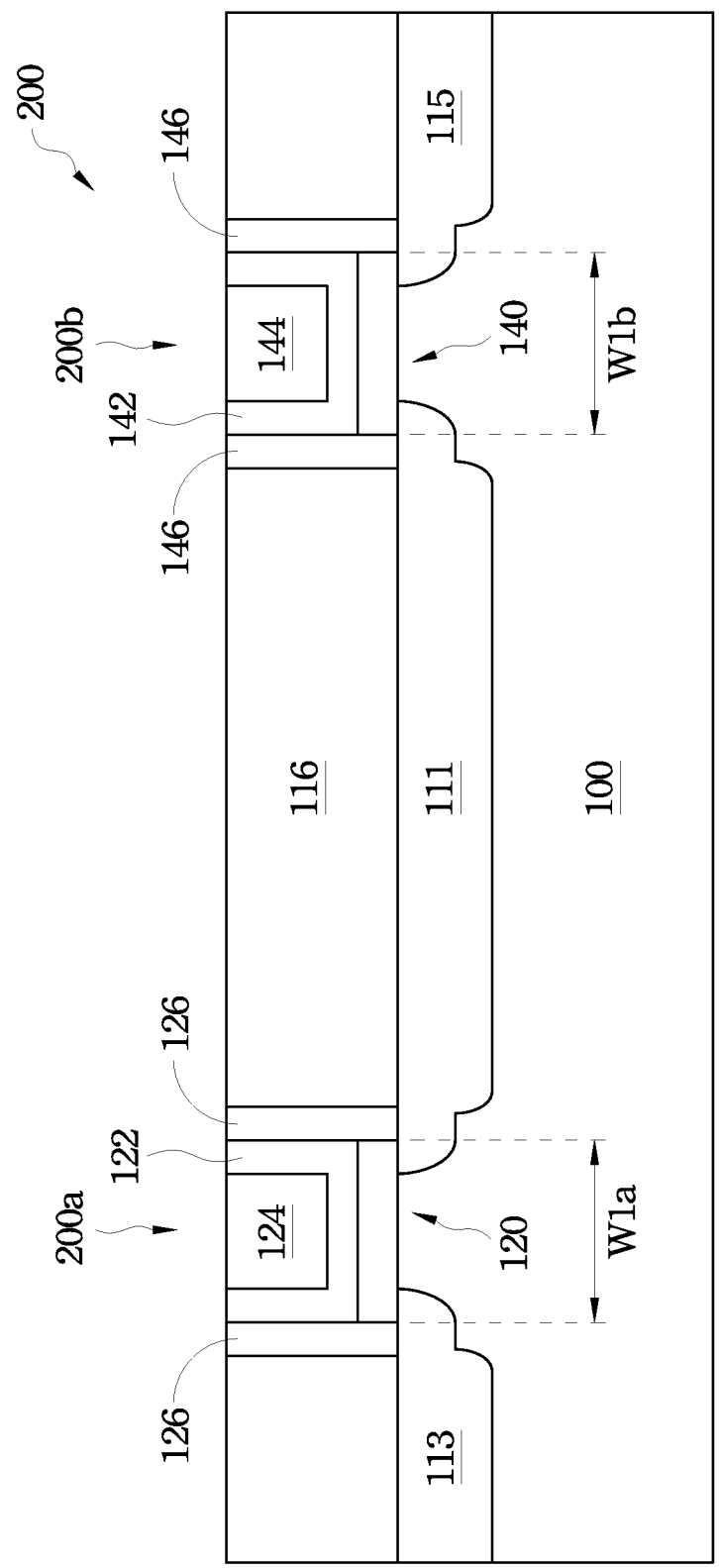
FIGS. 2-7A are various diagrammatic cross-sectional views and perspective views of an embodiment of an integrated circuit device during various fabrication stages according to the method of FIG. 1.

Referring to FIGS. 1 and 2, the method 100 begins at step 102, wherein a substrate 100 is provided. In the present embodiment, the substrate 100 is a semiconductor substrate comprising silicon. Alternatively, the substrate 100 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 100 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 100, in a P-well structure, in an N-well structure, in a dual-well structure, or using a raised structure. The semiconductor device 200 may include a NFET device and/or a PFET device, and thus, the substrate 100 may include various doped regions configured for a particular device in each of the NFET device and/or the PFET device.

Referring again to FIG. 1, an interlayer dielectric (ILD) 116, often referred to as ILD0, can be disposed over the substrate 100. The ILD layer 116 may include a dielectric material, such as an oxide, a nitride, an oxynitride, a low-k dielectric material, an ultra low-k dielectric material, an extreme low-k dielectric material, another dielectric material, or combinations thereof. The ILD layer 116 may be formed by, for example, a chemical vapor deposition (CVD) process, a high-density plastic (HDP) CVD process, a high aspect ratio process (HARP), a spin-coating process, other deposition processes, and/or any combinations thereof. In other embodiments, additional dielectric layers (not shown) can be formed below or over the ILD 116.

In embodiments, a first gate strip 200a and a second gate strip 200b are formed in the ILD 116 and over the substrate 100. The first gate strip 200a may include, in order, a gate dielectric 120 and a gate electrode 122. The second gate strip 200b may include, in order, a gate dielectric 140 and a gate electrode 142. The first and second gate strips 200a, 200b may have a width W1a and W1b, respectively, formed by deposition.

In embodiments, the gate dielectrics 120 and 140 include a dielectric material, such as a silicon oxide, a silicon oxynitride, a silicon nitride, a high-k dielectric material, another suitable dielectric material, or combinations thereof. Exemplary high-k dielectric materials include $HfO_2$, HfSiO, HfSiON, HfTaO, HfSiO, HfZrO, other suitable materials, or combinations thereof. The gate dielectrics 120, 140 may be a multilayer structure, for example, including an interfacial layer, and a high-k dielectric material layer formed on the interfacial layer. An exemplary interfacial layer may be a grown silicon oxide layer formed by a thermal process or atomic layer deposition (ALD) process.

The gate electrodes 122, 142 formed over the gate dielectrics 120, 140, respectively, may each include a conductive layer having a proper work function. Therefore, the gate electrodes 122, 142 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials.

In embodiments, gate spacers 126, 146 are formed in the ILD 116 and overlying opposite sidewalls of the first gate strip 200a and the second gate strip 200b, respectively, by a suitable process. The gate spacers 126, 146 may include a dielectric material such as an oxide, a nitride, an oxynitride, another dielectric material, or combinations thereof. In another embodiment, liners (not shown) may be formed between the gate strips 200a, 200b and the gate spacers 126, 146 by a suitable process. The liners may comprise a suitable dielectric material different from the gate spacers 126, 146.

In embodiments, an electrical transmission structure 124 and an electrical transmission structure 144 are formed in the ILD 116 and over the gate electrodes 122, 142, respectively. The electrical transmission structures 124, 144 may each include a conductive material, such as aluminum, copper, tungsten, metal alloys, metal silicides, other suitable materials, or combinations thereof. The electrical transmission structures 124, 144 may be formed by deposition and chemical mechanical polish (CMP).

In some embodiments, a common source or a common drain region 111 (referred to as a source/drain hereinafter) may be located in substrate 100 and between the first and second gate strips 200a and 200b. Source/drain regions 113 and 115 may be formed adjacent to the first and second gate strips 200a and 200b, respectively. The first gate strip 200a and source/drain regions 111 and 113 form a first MOS device, and the second gate strip 200b and source/drain regions 111 and 115 form a second MOS device.

Figure 3:
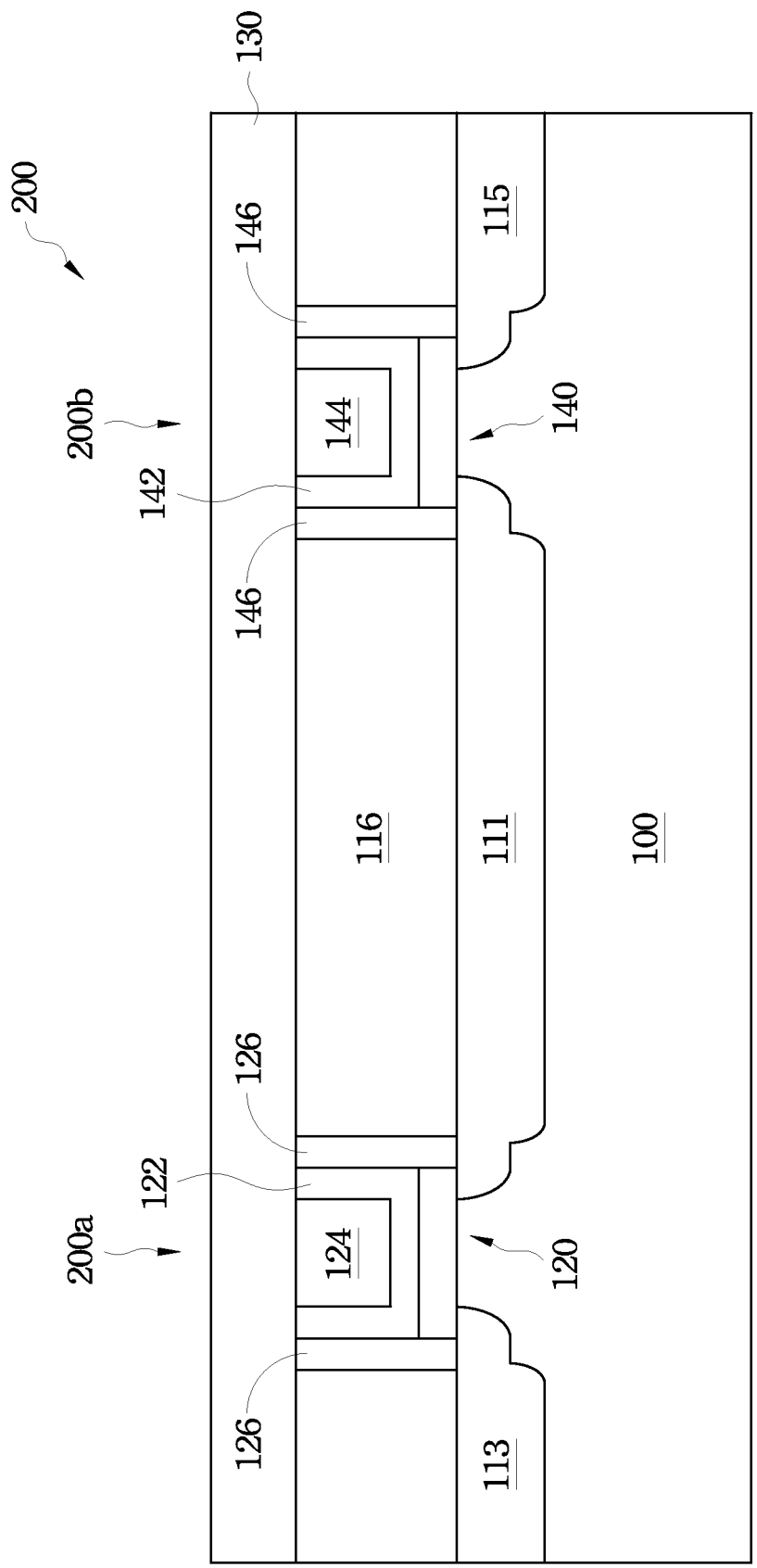

Referring to FIGS. 1 and 3, the method 100 continues with step 104 in which a conductive layer 130 is formed over the ILD layer 116, the first and second gate strips 200a, 200b, and the electrical transmission structures 124, 144. The conductive layer 130 may be a metal layer, such as aluminum, copper, tungsten; a metal alloy layer, such as TiN, TiW, TaN; other suitable materials; or combinations thereof. In some embodiments, the conductive layer 130 has a thickness ranging between about 100 Angstroms and about 10,000 Angstroms.

Figure 4:
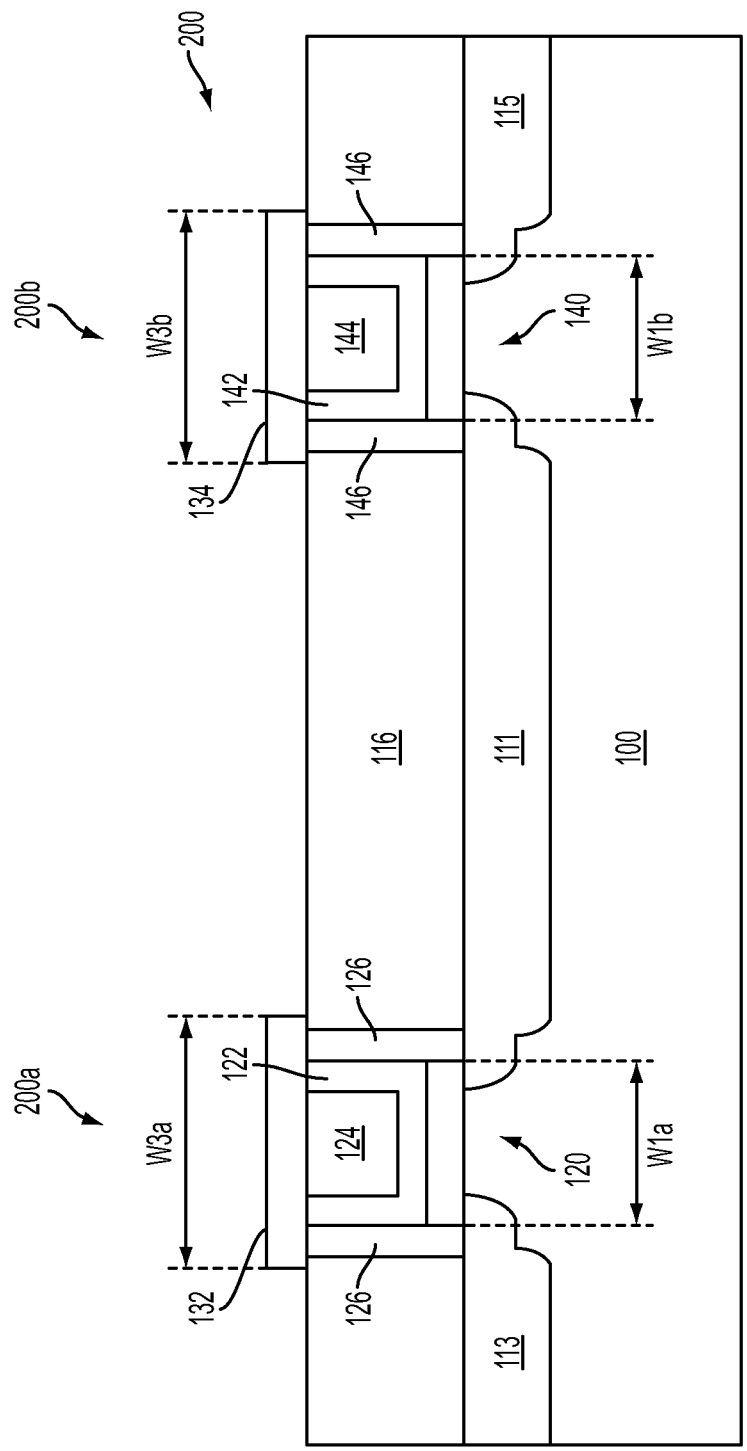

Referring to FIGS. 1 and 4, the method 100 continues with step 106 in which the conductive layer 130 is patterned by a patterning process to form conductive strips 132, 134. The conductive strip 132 is over the first gate strip 200a and the electrical transmission structure 124. The conductive strip 134 is over the second gate strip 200b and the electrical transmission structure 144. The patterning process, for example, includes forming a layer of photoresist (not shown) over the conductive layer 130 by a suitable process, such as spin-on coating, and then exposing and developing the layer of photoresist to form a photoresist feature. Then, the pattern of the photoresist feature can be transferred to the underlying conductive layer 130 to form the conductive strips 132, 134 by a dry etching process. In some embodiments, the conductive strips 132, 134 may have a width W3a, W3b, respectively. In one embodiment, the widths W3a, W3b, are greater than the widths W1a, W1b, respectively. In other embodiment, a ratio of the width W3a to the width W1a and/or a ratio of the width W3b to the width W1b range between about 1 and about 6.

Figure 4A:
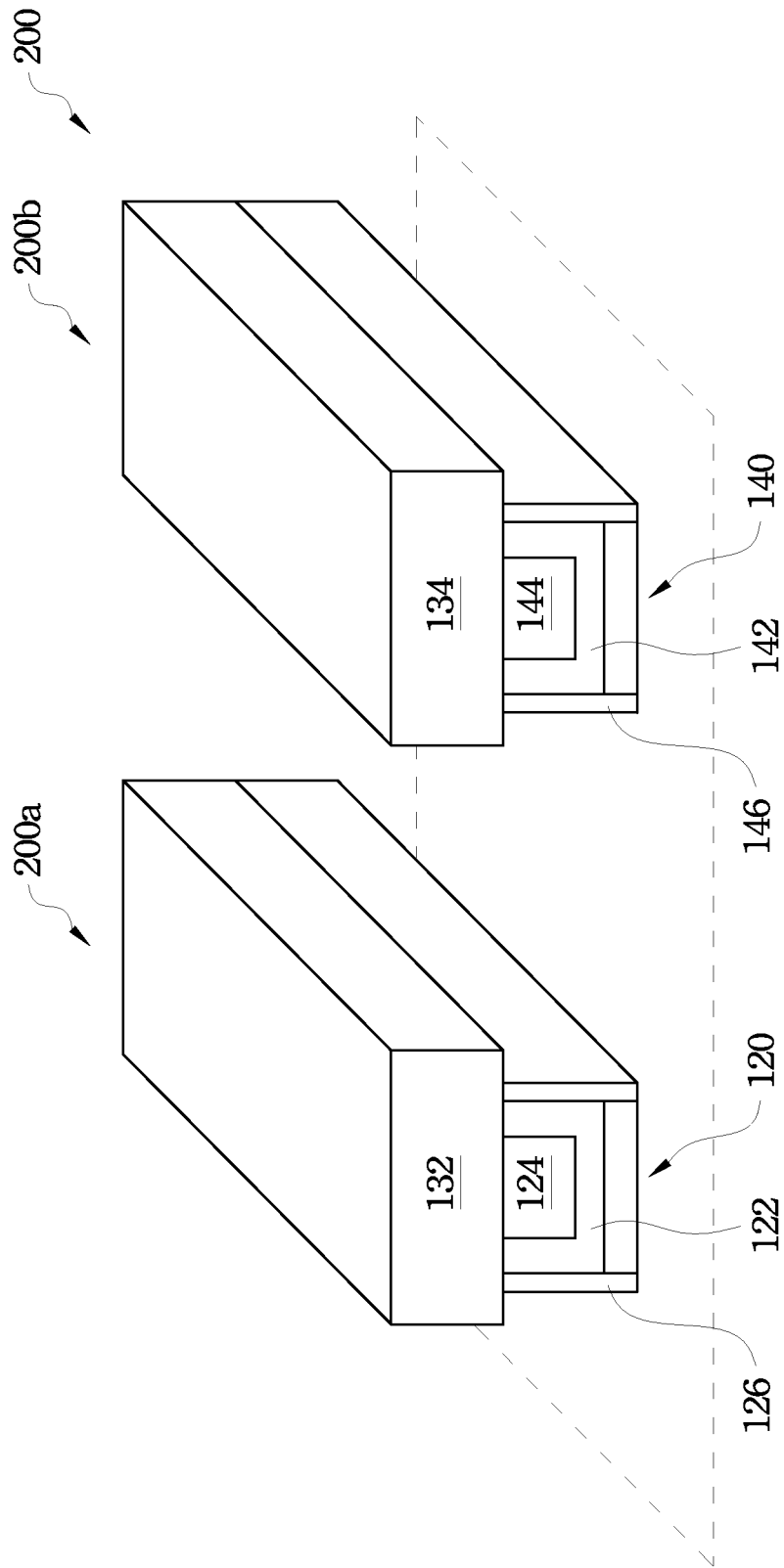

Alternatively, the step 104 for forming the conductive layer 130 may be omitted when the conductive layer 130 uses the material same as to the electrical transmission structures 124, 144. For example, the related process flow may include depositing an Al layer in and over the ILD116 and over the first and second gate strips 200a, 200b; removing a portion of the Al layer over the ILD 116 to form a planarized surface; and patterning the planarized Al layer to form the electrical transmission structures 124, 144 and the conductive strips 132, 134. A perspective view of the structure shown in FIG. 4 is illustrated in FIG. 4A.

Figure 5:
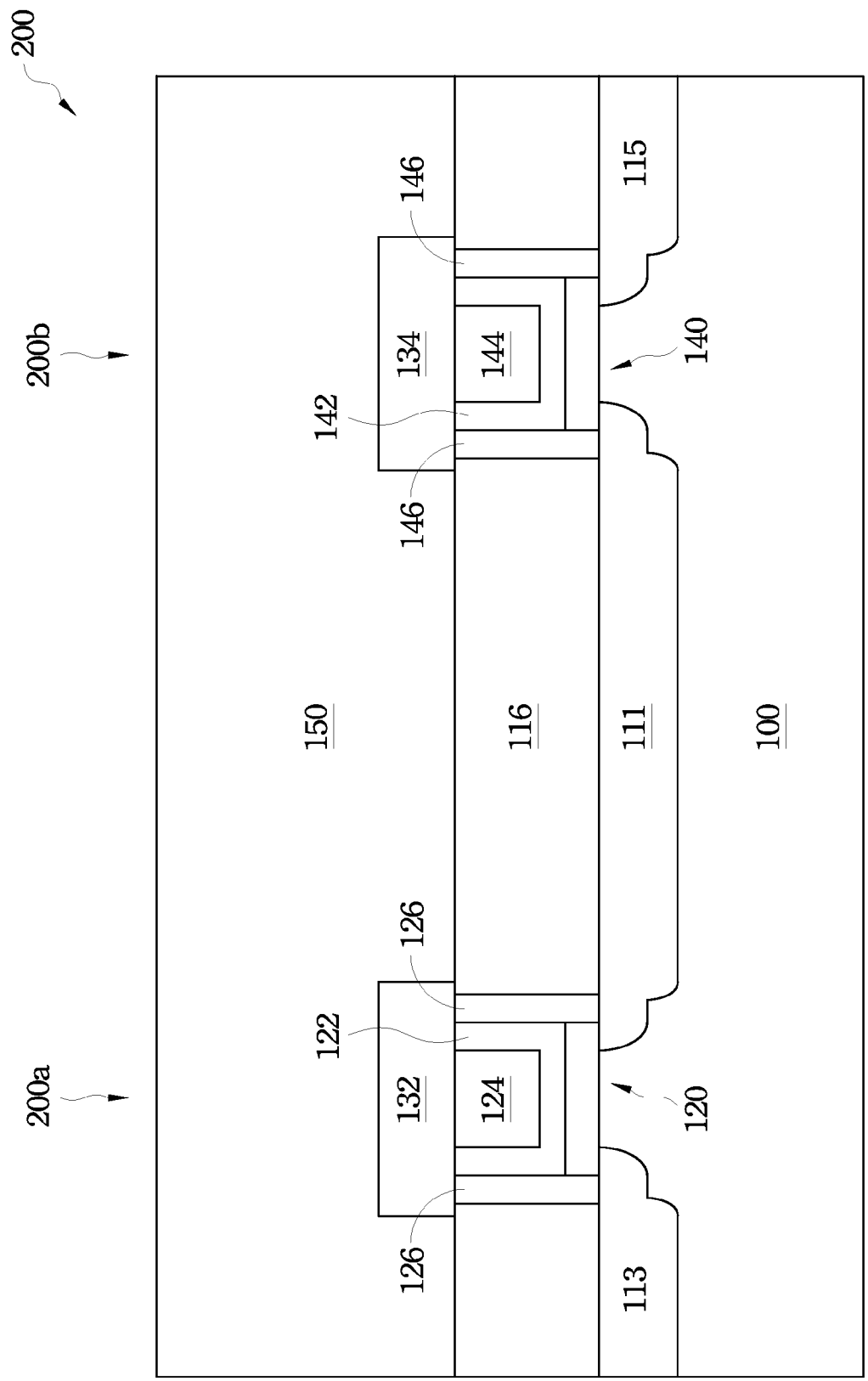

Referring to FIGS. 1 and 5, the method 100 continues with step 108 in which an additional ILD 150, often referred to as ILD1, is formed over the conductive strips 132, 134 and the ILD 116. The additional ILD layer 150 may include a dielectric material, such as an oxide, a nitride, an oxynitride, a low-k dielectric material, an ultra low-k dielectric material, an extreme low-k dielectric material, another dielectric material, or combinations thereof. The additional ILD layer 150 may be formed by, for example, a CVD process, a HDP CVD process, a HARP, a spin-coating process, another deposition process, and/or any combinations thereof. In embodiments, the additional ILD layer 150 may include a material that is the same as is used for ILD 116.

Figure 6:
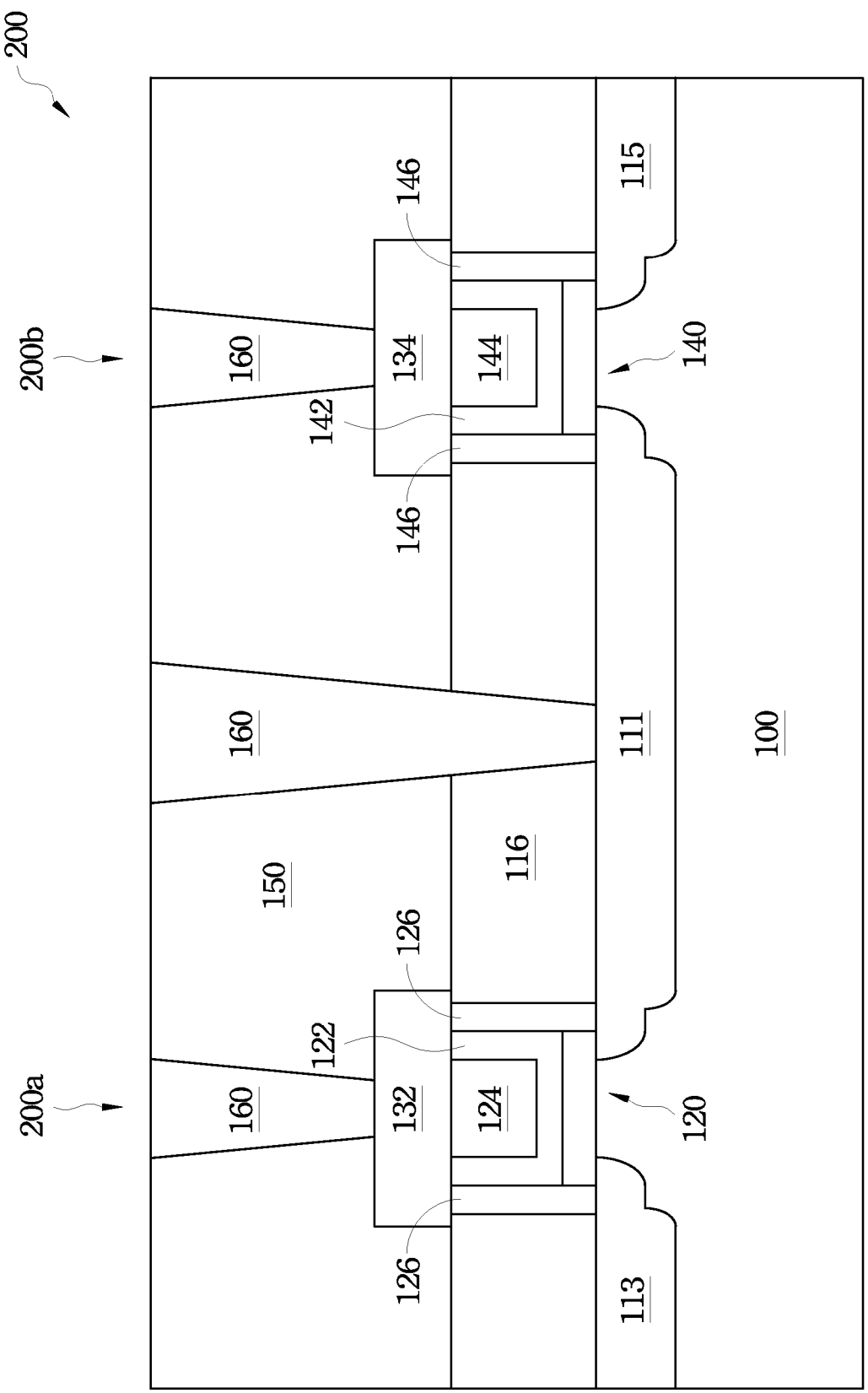

Referring to FIGS. 1 and 6, the method 100 continues with steps 110, 112 in which contact openings (not shown) are formed in the additional ILD 150 and/or the ILD 116 by a commonly used etching process. In embodiments, at least three contact openings are formed over the conductive strips 132, 134 and the common source/drain region 111. Subsequently, a conductive layer (not shown) may be filled in the contact openings and above the additional ILD 150. Then, a CMP process may be provided to completely remove the portion of conductive layer over the additional ILD 150 and form contact plugs 160 in the additional ILD 150 and/or the ILD 116.

Figure 7:
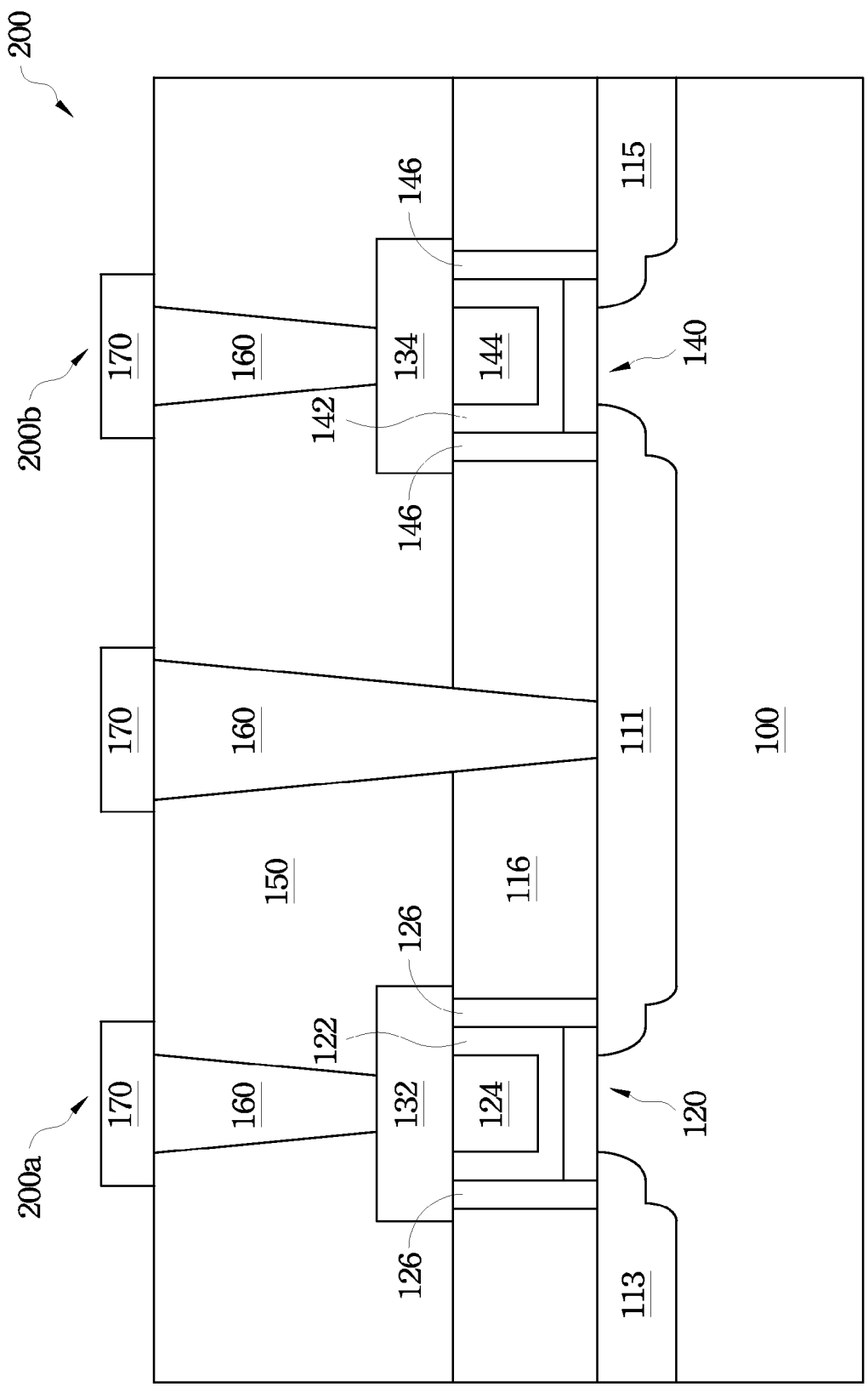
Figure 7A:
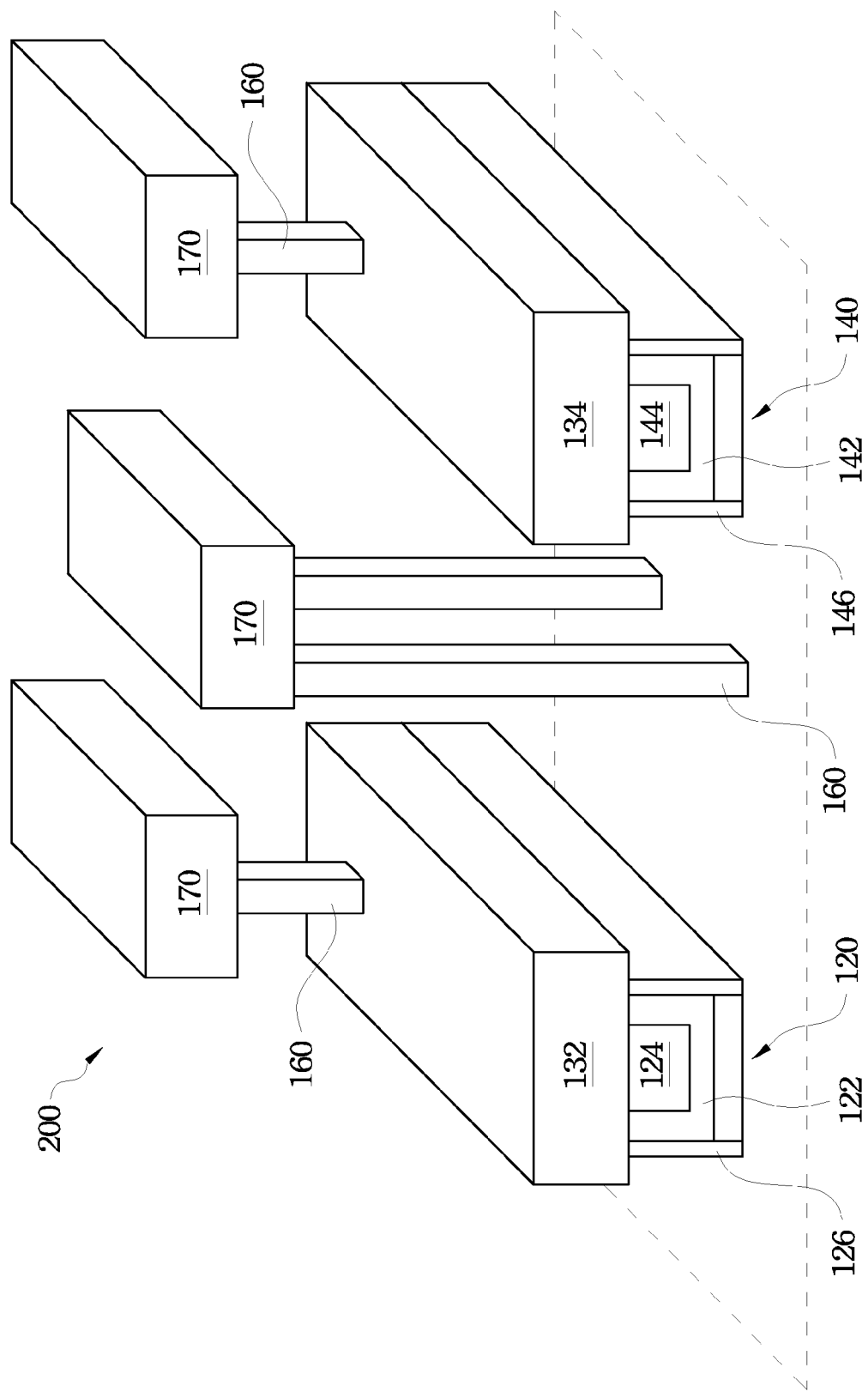

Referring to FIGS. 1 and 7, the method 100 continues with steps 114 in which metal lines 170, often referred to as M1, are formed over the contact plugs 160. A perspective view of the structure shown in FIG. 7 is illustrated in FIG. 7A.

Figure 8:
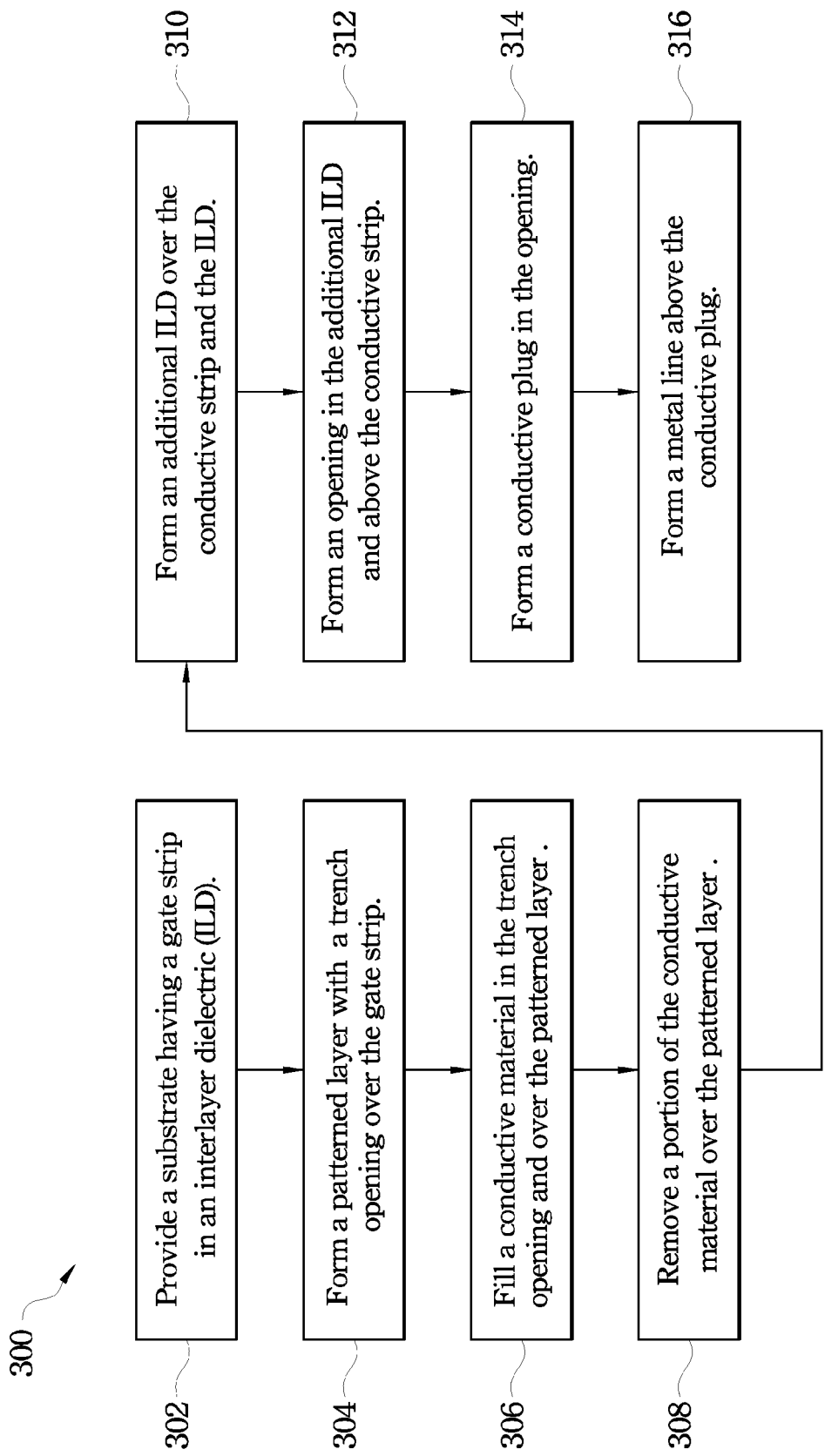
FIG. 8 is a flow chart of a method for fabricating an integrated circuit device according to another embodiment of the present disclosure.

With reference to FIGS. 9-14, various diagrammatic cross-sectional views of an embodiment of a semiconductor device 400 during various fabrication stages according to a method 300 of FIG. 8 are collectively described below. The semiconductor device 400 illustrates an integrated circuit, or portion thereof, that can comprise memory cells and/or logic circuits. The semiconductor device 400 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), radio frequency CMOS (RFCMOS), high voltage transistors, other suitable components, and/or combinations thereof. It is understood that additional steps can be provided before, during, and/or after the method 300, and some of the steps described below can be replaced or eliminated, for additional embodiments of the method. It is further understood that additional features can be added in the semiconductor device 400, and some of the features described below can be replaced or eliminated, for additional embodiments of the semiconductor device 400.

Figure 9:
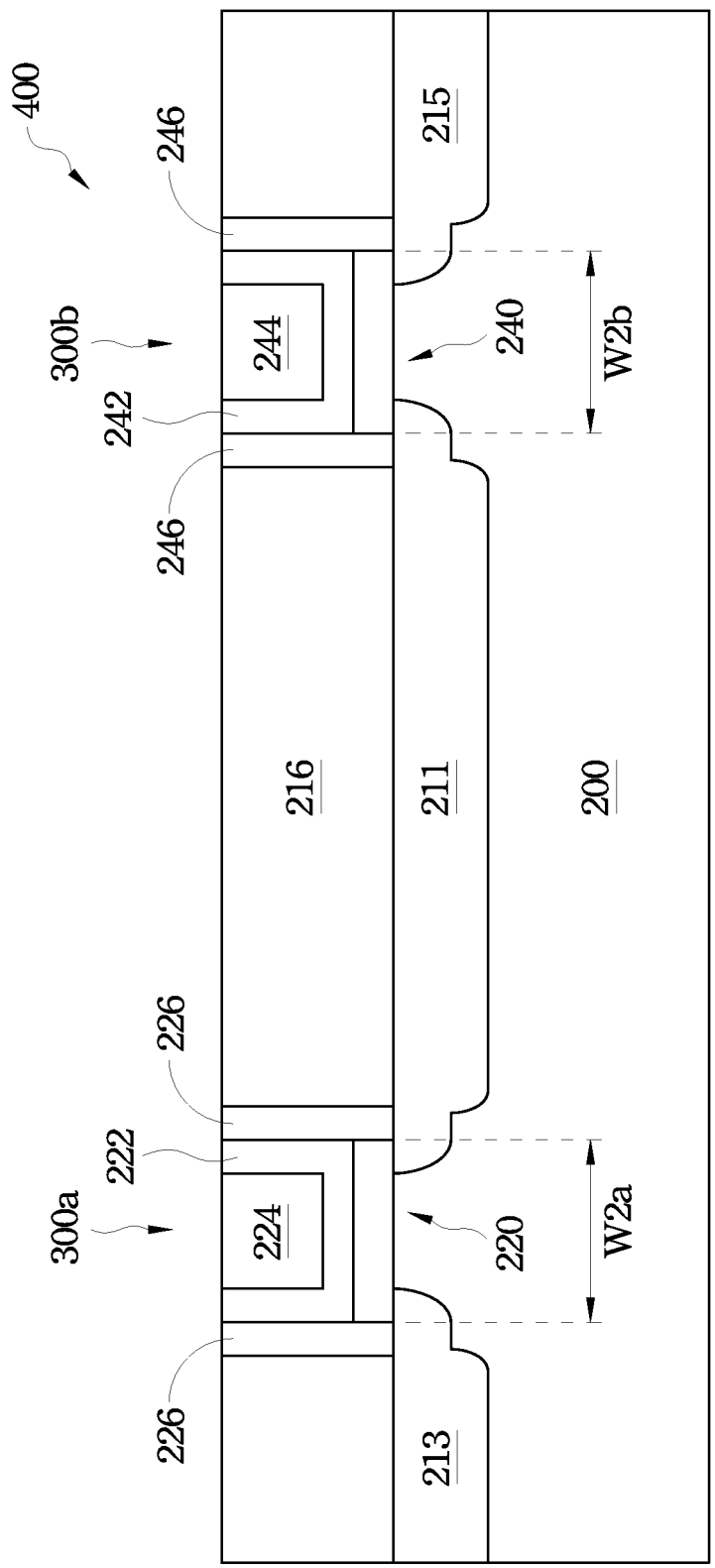
FIGS. 9-14 are various diagrammatic cross-sectional views of an embodiment of an integrated circuit device during various fabrication stages according to the method of FIG. 8.

Referring to FIGS. 8 and 9, the method 300 begins at step 302, wherein a structure of the semiconductor device 400 is provided with the same items in FIG. 1 indicated by the same reference numerals, increased by 100. In embodiments, an ILD layer 216 is positioned over a substrate 200. In embodiments, a first gate strip 300a including a gate electrode 222 over a gate dielectric 220 and a second gate strip 300b including a gate electrode 242 over a gate dielectric 240 are positioned in the ILD 216. The first and second gate strips 300a, 300b each has a width W2a, W2b, respectively. In embodiments, a common source/drain 211 is located in substrate 200 and between the first and second gate strips 300a and 300b. Source/drain regions 213 and 215 may be adjacent to the first and second gate strips 300a and 300b, respectively. In embodiments, gate spacers 226, 246 are positioned in the ILD 216 and overlying opposite sidewalls of the first and second gate strips 300a, 300b, respectively. In embodiments, electrical transmission structures 224, 244 are positioned in the ILD 216 and over the gate electrodes 222, 242, respectively.

Figure 10:
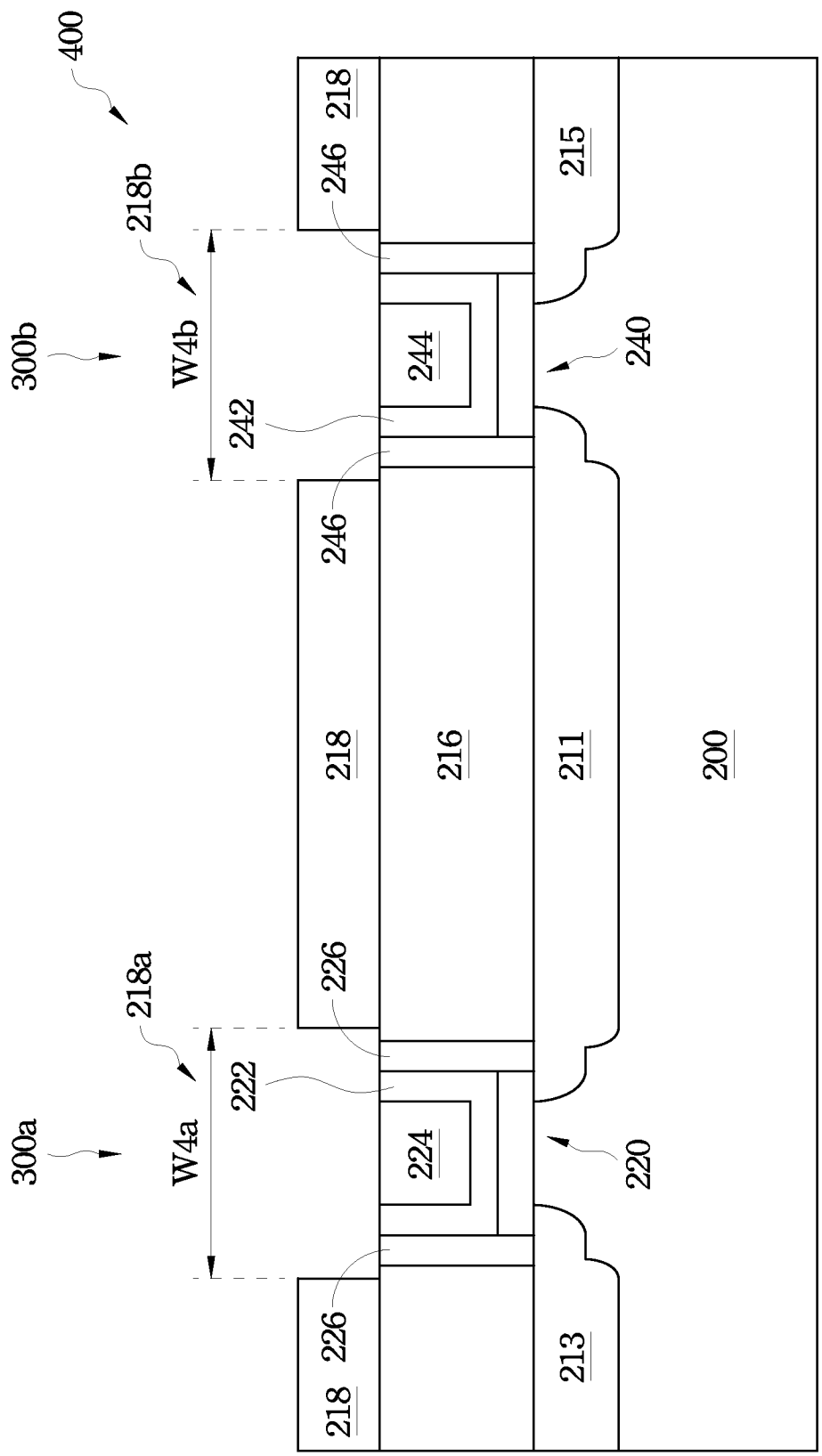

Referring to FIGS. 8 and 10, the method 300 continues with steps 304 in which a patterned layer 218 is formed over the ILD 216. In one embodiment, the patterned layer 218 is a dielectric layer. In another embodiment, the patterned layer 218 includes a material which is the same as is used for the ILD 216. In embodiments, the patterned layer 218 has a trench opening 218a above the first gate strip 300a and a trench opening 218b above the second gate strip 300b. The trench openings 218a, 218b have widths W4a, W4b, respectively. In embodiments, the patterned layer 218 has a thickness ranging between about 100 Angstroms and about 10,000 Angstroms.

Figure 11:
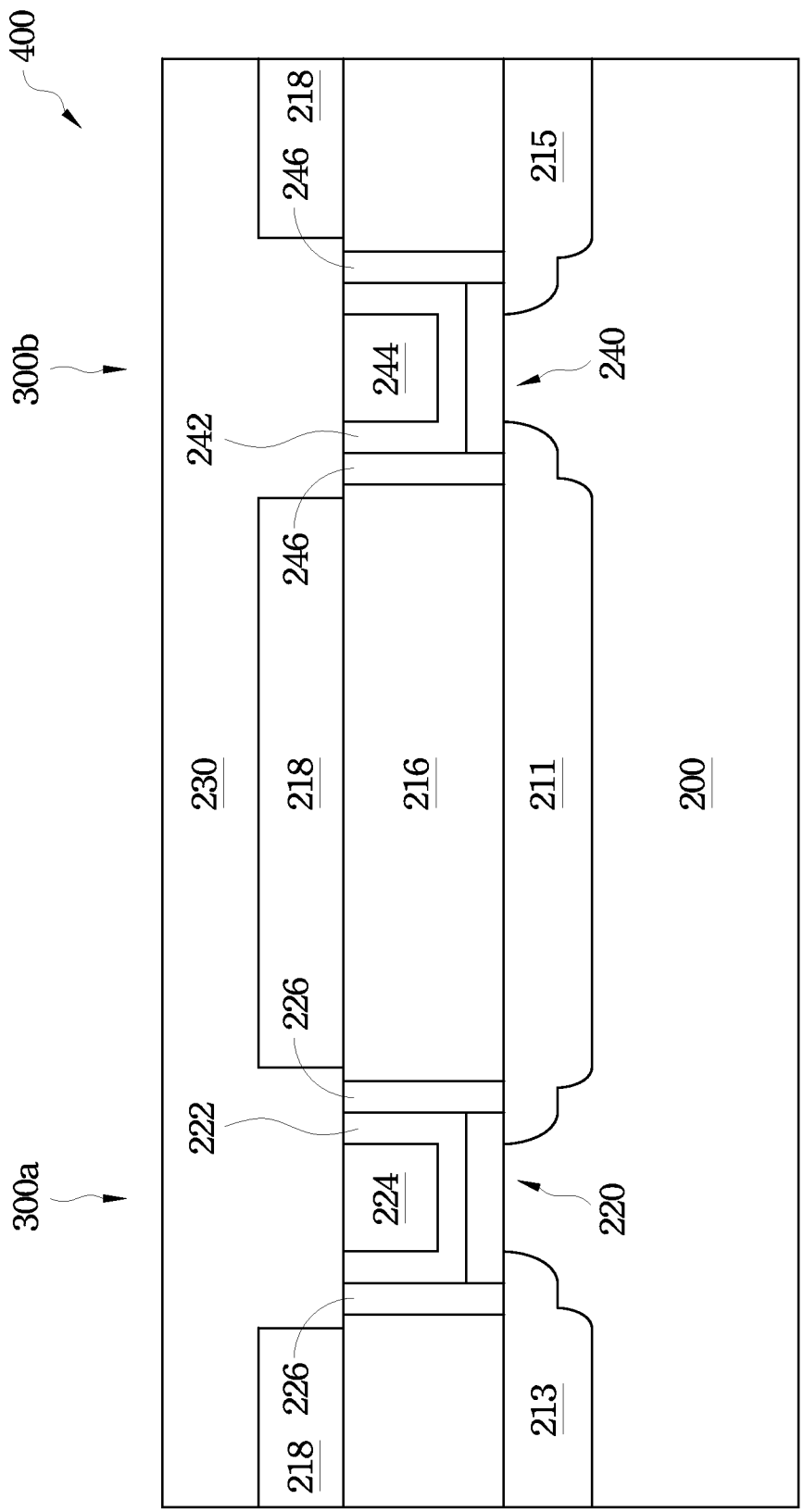

Referring to FIGS. 8 and 11, the method 300 continues with steps 306 in which a conductive layer 230 is formed in the trench openings 218a, 218b and over the patterned layer 218. The conductive layer 230 may be a metal layer, such as aluminum, copper, tungsten; a metal alloy layer, such as TiN, TiW, TaN; other suitable materials; or combinations thereof.

Figure 12:
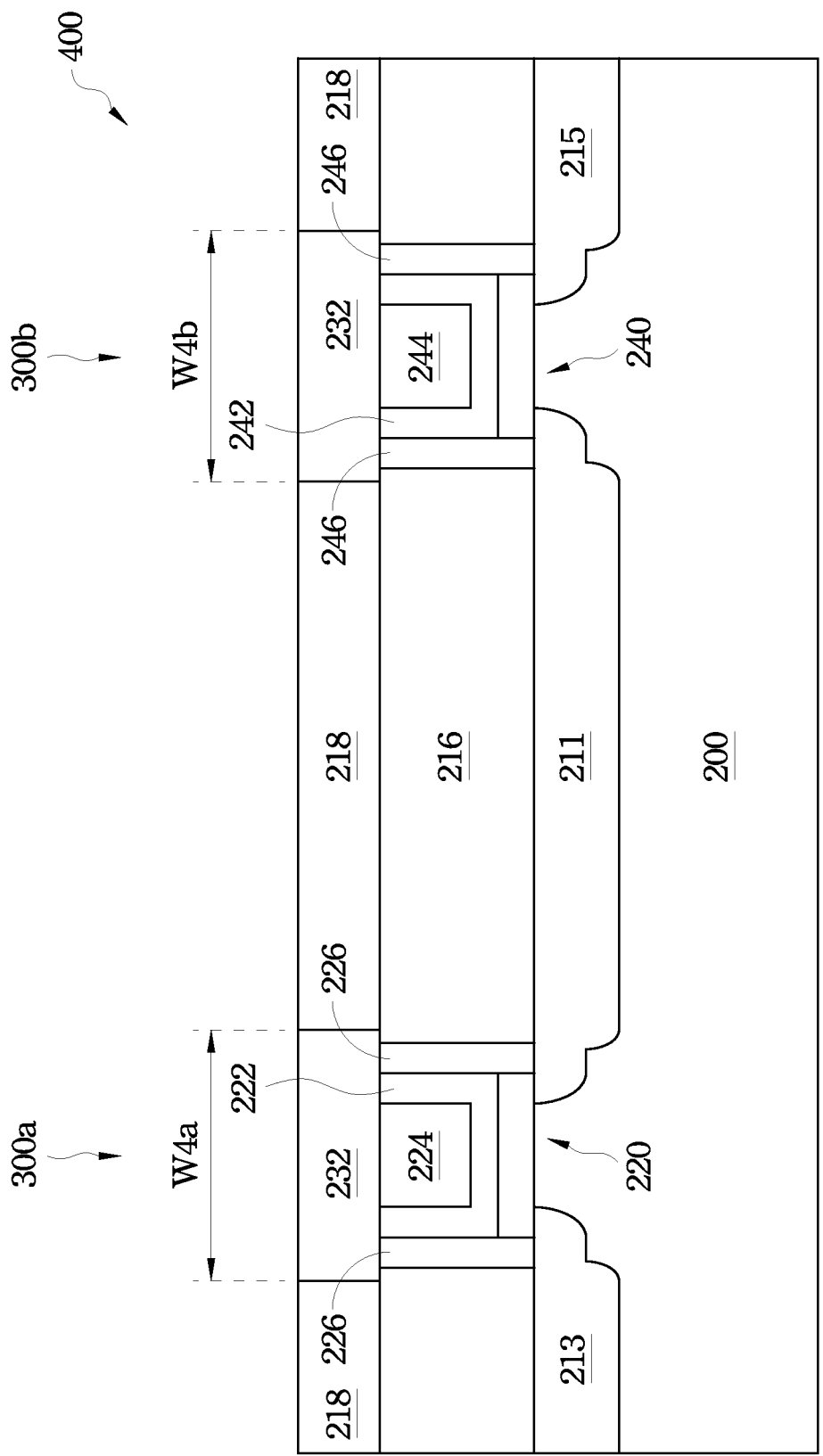

Referring to FIGS. 8 and 12, the method 300 continues with steps 308 in which portions of the conductive layer 230 over the patterned layer 218 are removed to form conductive strips 232, 234. The conductive strip 232 over the electrical transmission structure 224 and the first gate strip 300a has the width W4a. The conductive strip 234 over the electrical transmission structure 244 and the second gate strip 300b has the width W4b. In embodiments, the removing process includes a CMP process, therefore, the conductive strips 232, 234 have planarized surfaces substantially co-planar with the surface of the patterned layer 218.

Figure 13:
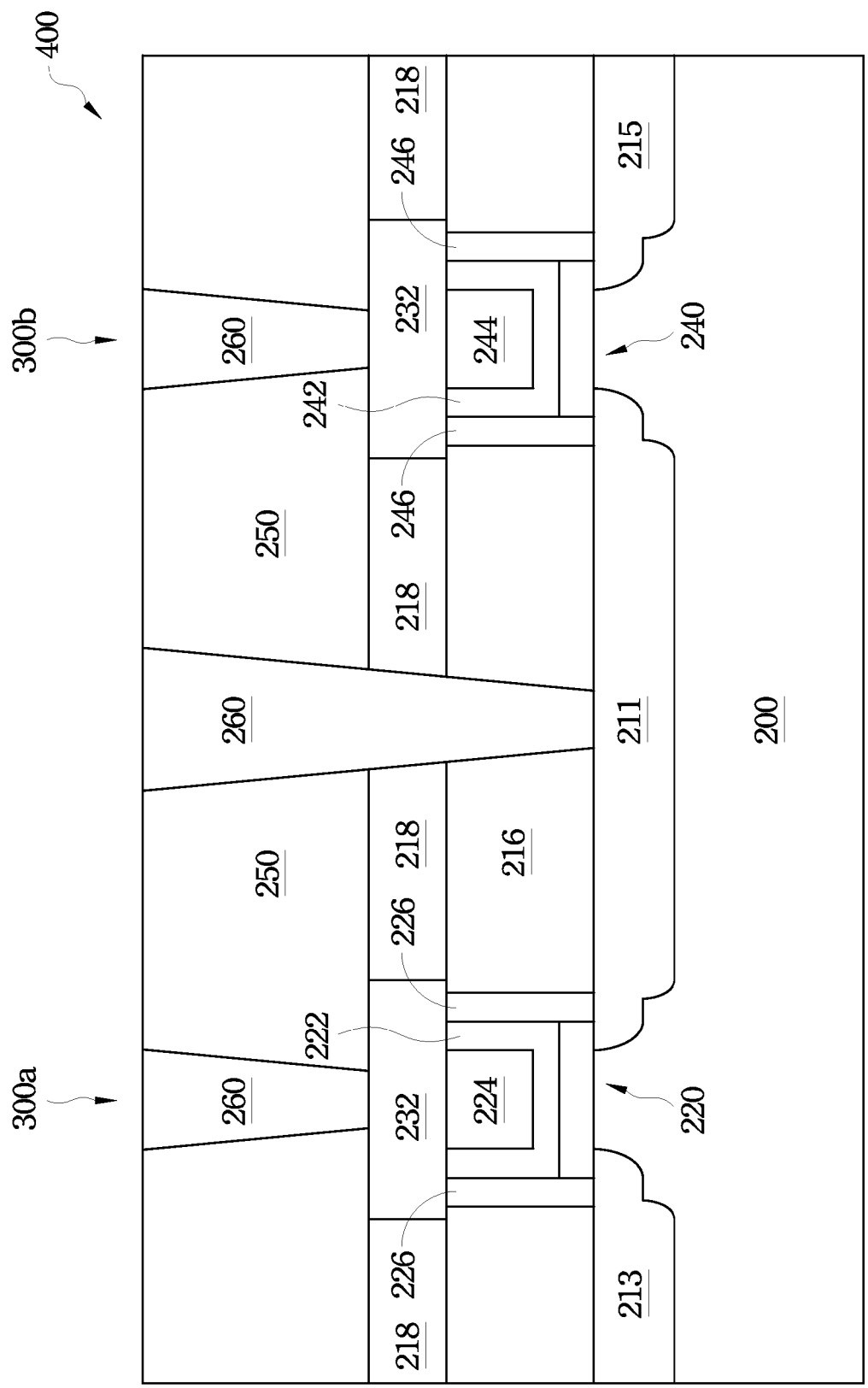

Referring to FIGS. 8 and 13, the method 300 continues with steps 310-314 in which an additional ILD 250 is formed over the conductive strips 232, 234 and the patterned layer 218. The additional ILD layer 250 may include a dielectric material, such as an oxide, a nitride, an oxynitride, a low-k dielectric material, an ultra low-k dielectric material, an extreme low-k dielectric material, another dielectric material, or combinations thereof. In embodiments, the additional ILD layer 250 may include a material which is the same as is used for the ILD 216. Subsequently, contact openings (not shown) are formed in the additional ILD 250, the patterned layer 218, and/or the ILD 216 by an etching process. In embodiments, at least three contact openings are formed over the conductive strips 232, 234 and the common source/drain 211. Thereafter, a conductive layer (not shown) may be filled in the contact openings and above the additional ILD 250, and then, a CMP process may be provided to completely remove the portion of conductive layer over the additional ILD 250 and form contact plugs 260 in the additional ILD 250, the patterned layer 218, and/or the ILD 216.

Figure 14:
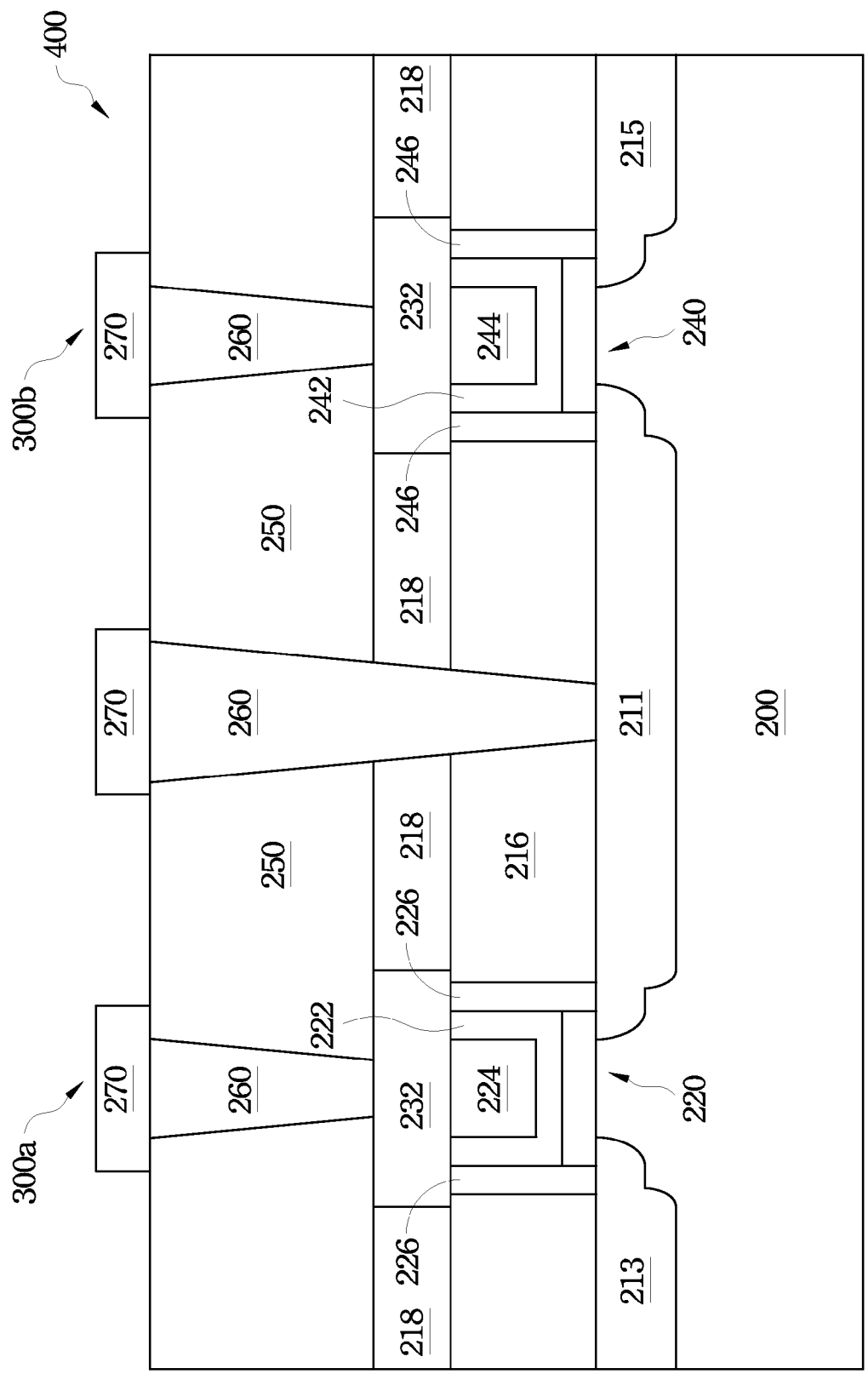

Referring to FIGS. 8 and 14, the method 300 continues with steps 316 in which metal lines 270 are formed over the contact plugs 260. A perspective view of the structure shown in FIG. 14 is the same as illustrated in FIG. 7A.

The embodiments of the present invention have several advantageous features. By forming the conductive strip with sufficient thickness and parallel with the gate strip, the overall gate resistance is reduced. Therefore, the electrical performance of CMOS devices is improved. This is particularly beneficial for RFCMOS devices formed by the gate-last approach due to high gate resistance may cause degradation on electrical maximum oscillation frequency (fmax), noise, and stability when the devices performing at high frequencies.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming a gate strip in a first inter-layer dielectric (ILD) over a substrate, wherein the gate strip comprises gate spacers, and the gate strip has a first width measured in a first direction parallel to a top surface of the first ILD;
forming a conductive strip having a second width measured in the first direction in direct contact with the gate strip, wherein the second width is greater than the first width, and forming the conductive strip comprises forming a bottom-most surface of the conductive strip over a top surface of the first ILD;
forming a second ILD over the first ILD and the conductive strip; and
forming a conductive plug in the second ILD and over the conductive strip.

2. The method of claim 1, wherein the step of forming the conductive strip comprises:
forming a conductive layer over the gate strip and the first ILD; and
patterning the conductive layer to form the conductive strip.

3. The method of claim 1, wherein the conductive strip comprises a material of W, Al, Cu, TiN, TaN, TiW, or combinations thereof.

4. The method of claim 1, wherein the conductive strip has a thickness ranging between about 100 Angstroms and about 10,000 Angstroms.

5. The method of claim 1, wherein the gate strip comprises a metal gate.

6. The method of claim 1, further comprising:
forming an electrical transmission structure between the gate strip and the conductive strip.

7. The method of claim 6, wherein the electrical transmission structure is Al and/or metal silicide.

8. The method of claim 1, wherein forming the conductive strip comprises forming the conductive strip having a longitudinal axis parallel to a longitudinal axis of the gate strip.

9. A method comprising:
forming a gate strip having a first width, wherein the gate strip comprises spacers, and the gate strip is in a first inter-layer dielectric (ILD) over a substrate;
forming a patterned layer over the gate strip, wherein the patterned layer has a trench opening above the gate strip;
forming a conductive strip in the trench opening, wherein an entirety of the conductive strip has a second width, wherein the second width is constant along a direction perpendicular to a top surface of the substrate, the conductive strip is in direct contact with the gate strip, and the conductive strip extends along a top surface of the spacers;
forming a second ILD over the conductive strip; and
forming a conductive plug in the second ILD and above the conductive strip.

10. The method of claim 9, wherein the step of forming a conductive strip comprises:
filling a conductive material in the trench opening and over the patterned layer; and
removing a portion of the conductive material over the patterned layer.

11. The method of claim 10, wherein the step of removing the portion of the conductive material is performed by a chemical mechanical polish (CMP).

12. The method of claim 9, wherein the patterned layer is a dielectric layer.

13. The method of claim 9, wherein the conductive strip comprises a material of W, Al, Cu, TiN, TaN, TiW, or combinations thereof.

14. The method of claim 9, wherein a ratio of the second width to the first width ranges between about 1 to about 6.

15. The method of claim 9, wherein forming the conductive strip comprises forming the conductive strip having a longitudinal axis parallel to a longitudinal axis of the gate strip.

16. A method comprising:
forming a first gate strip in a first inter-layer dielectric (ILD) over a substrate, wherein the first gate strip comprises spacers and has a first width in a first direction and a longitudinal axis extending in a second direction perpendicular to the first direction;
forming a second gate strip having a second width in the first ILD, wherein the second gate strip comprises spacers and the second width is in the first direction;
forming a first conductive strip in direct contact with the first gate strip, wherein the first conductive strip has a third width in the first direction, the third width being greater than the first width, and a longitudinal axis extending parallel to a longitudinal axis of the first gate strip;
forming a second conductive strip in direct contact with the second gate strip, wherein the second conductive strip has a fourth width in the first direction, the fourth width being greater than the second width, and a ratio of the second width to the fourth width is constant along a direction perpendicular to a top surface of the substrate, wherein a distance measured in the first direction between the first conductive strip and the second conductive strip is less than a distance measured in the first direction between the first gate strip and the second gate strip; and
forming a second ILD over the first ILD, the first conductive strip and the second conductive strip.

17. The method of claim 16, wherein forming the first conductive strip comprises forming the first conductive strip having a thickness ranging between about 100 Angstroms and about 10,000 Angstroms, and forming the second conductive strip comprises forming the second conductive strip having a thickness ranging between about 100 Angstroms and about 10,000 Angstroms.

18. The method of claim 16, wherein a ratio of the third width to the first width ranges from about 1 to about 6, and a ratio of the fourth width to the second width ranges from about 1 to about 6.

19. The method of claim 16, wherein forming the first conductive strip comprises forming the first conductive strip comprises a material of W, Al, Cu, TiN, TaN, TiW, or combinations thereof, and forming the second conductive strip comprises forming the second conductive strip comprises a material of W, Al, Cu, TiN, TaN, TiW, or combinations thereof.

20. The method of claim 16, wherein forming the second ILD comprises forming the second ILD having a same material as the first ILD.

21. The method of claim 16, further comprising forming a patterned layer over the first gate strip and the second gate strip, wherein the patterned layer has a first trench opening above the first gate strip and a second trench opening above the second gate strip, wherein forming the first conductive strip comprises forming the first conductive strip in the first trench opening, and forming the second conductive strip comprises forming the second conductive strip in the second trench opening.

* * * * *